(12) United States Patent
Hase et al.

(10) Patent No.: US 12,712,502 B2
(45) Date of Patent: Aug. 18, 2026

(54) TRANSMISSION CIRCUIT

(71) Applicant: Murata Manufacturing Co., Ltd., Kyoto (JP)

(72) Inventors: Masatoshi Hase, Kyoto (JP); Tsutomu Oonaro, Kyoto (JP); Takashi Soga, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 428 days.

(21) Appl. No.: 18/515,574

(22) Filed: Nov. 21, 2023

(65) Prior Publication Data

US 2024/0088850 A1 Mar. 14, 2024

Related U.S. Application Data

(63) Continuation of application No. PCT/JP2022/020706, filed on May 18, 2022.

(30) Foreign Application Priority Data

May 26, 2021 (JP) ................................ 2021-088468

(51) Int. Cl.
*H03F 3/04* (2006.01)
*H03F 1/02* (2006.01)
(Continued)

(52) U.S. Cl.
CPC .......... *H03F 3/245* (2013.01); *H03F 1/0211* (2013.01); *H03F 3/195* (2013.01); *H03F 1/302* (2013.01);
(Continued)

(58) Field of Classification Search
CPC ........ H03F 3/245; H03F 1/0211; H03F 3/195; H03F 2200/451; H03F 3/211;
(Continued)

(56) References Cited

U.S. PATENT DOCUMENTS 6,052,032 A 4/2000 Järvinen
9,240,760 B2 * 1/2016 Ishimoto ................ H03F 1/523
(Continued)

FOREIGN PATENT DOCUMENTS

CN 104641553 A 5/2015
CN 109428557 A 3/2019
(Continued)

OTHER PUBLICATIONS

Rakús, Matej et al., "Design techniques for low-voltage analog integrated circuits", Journal of Electrical Engineering, vol. 68, No. 4, pp. 245-255, 2017.
(Continued)

*Primary Examiner* — Khanh V Nguyen
(74) *Attorney, Agent, or Firm* — McDonald Hopkins LLC

(57) ABSTRACT

A transmission circuit appropriately controls output power in response to fluctuations in the impedance of a load. A transmission circuit includes: a transistor to which a bias current IB1 is supplied and that amplifies and outputs an input signal RFin; a transistor to which a bias current IB2 is supplied, that has a collector connected to the collector of the transistor, and that amplifies and outputs the input signal; a current generation circuit that generates a current I2 on the basis of a current I1 from the emitter of the transistor; and a bias control circuit that outputs a first bias control signal
(Continued)

for controlling the bias current IB1 and a second bias control signal for controlling the bias current IB2 on the basis of the current I2.

11 Claims, 10 Drawing Sheets

(51) Int. Cl.
*H03F 1/30* (2006.01)
*H03F 3/195* (2006.01)
*H03F 3/24* (2006.01)

(52) U.S. Cl.
CPC .... *H03F 2200/18* (2013.01); *H03F 2200/451* (2013.01)

(58) Field of Classification Search
CPC ...... H03F 2200/18; H03F 1/0272; H03F 3/04; H03F 1/302; H03F 1/301; H04B 1/04; Y02D 30/70
USPC .......................................................... 330/296
See application file for complete search history.

(56) References Cited

U.S. PATENT DOCUMENTS

| | | | | |
|---|---|---|---|---|
| 9,755,578 | B2 | 9/2017 | Shi et al. | |
| 10,715,093 | B2 * | 7/2020 | Morisawa | H03F 3/191 |
| 2001/0013811 | A1 | 8/2001 | Morohashi et al. | |
| 2011/0025422 | A1 | 2/2011 | Marra et al. | |
| 2019/0280658 | A1 | 9/2019 | Morisawa et al. | |

FOREIGN PATENT DOCUMENTS

| | | | |
|---|---|---|---|
| JP | S49-017654 | A | 2/1974 |
| JP | H11-330866 | A | 11/1999 |
| JP | 2001-196868 | A | 7/2001 |
| JP | 2005-303401 | A | 10/2005 |
| JP | 2013-501430 | A | 1/2013 |
| JP | 2019-161640 | A | 9/2019 |

OTHER PUBLICATIONS

International Search Report for PCT/JP2022/020706 dated Aug. 16, 2022.

* cited by examiner

TRANSMISSION CIRCUIT

CROSS REFERENCE TO RELATED APPLICATION

This is a continuation of International Application No. PCT/JP2022/020706 filed on May 18, 2022 which claims priority from Japanese Patent Application No. 2021-088468 filed on May 26, 2021. The contents of these applications are incorporated herein by reference in their entireties.

BACKGROUND ART

Technical Field

The present disclosure relates to a transmission circuit.

In mobile communication performed by mobile phones and the like, communication using radio frequency (RF) signals is performed. In a mobile communication device, RF signals are transmitted by using a transmission circuit in which the power of a transmission signal is amplified by a transistor. In such a transmission circuit, for example, a bias current or voltage is supplied to the transistor in order to perform appropriate power amplification in accordance with the operation of the transmission circuit. Patent Document 1 describes a transmission circuit, which is a power amplifier circuit that suppresses heat generation upon power amplification to allow an appropriate operation of the transmission circuit.

Patent Document 1: U.S. Pat. No. 9,755,578

Non Patent Document

Non Patent Document 1: Matej Rakus et al., "Design techniques for low-voltage analog integrated circuits", Journal of ELECTRICAL ENGINEERING, VOL 68 NO 4, 245-255. 2017

BRIEF SUMMARY

In the power amplifier circuit described in Patent Document 1, to suppress heat generation of an amplifier transistor that performs power amplification, a bias current or voltage for the amplifier transistor is controlled on the basis of an output of a replica transistor different from the transistor. The output power of the transmission circuit may fluctuate in response to changes in the impedance of a load, such as an antenna that transmits a signal from the transmission circuit. In the power amplifier circuit described in Patent Document 1, the replica transistor is unable to replicate a changing operation of the amplifier transistor that is affected by fluctuations in the impedance of the load. Accordingly, appropriate control of the output power responsive to fluctuations in the impedance of the load has often not been satisfactorily performed.

The present disclosure provides a transmission circuit that appropriately controls the output power in response to fluctuations in the impedance of a load.

A transmission circuit according to an aspect of the present disclosure includes: a first amplifier transistor to which a first bias current or voltage is supplied and that amplifies and outputs an input signal; a second amplifier transistor to which a second bias current or voltage is supplied, that has a collector or drain connected to a collector or drain of the first amplifier transistor, and that amplifies and outputs the input signal; a current generation circuit that generates a second current on the basis of a first current from an emitter or source of the second amplifier transistor; and a bias control circuit that outputs a first bias control signal for controlling the first bias current or voltage and a second bias control signal for controlling the second bias current or voltage on the basis of the second current.

According to the present disclosure, it is possible to provide a transmission circuit that appropriately controls the output power in response to fluctuations in the impedance of a load.

DESCRIPTION OF EMBODIMENTS

Figure 1:
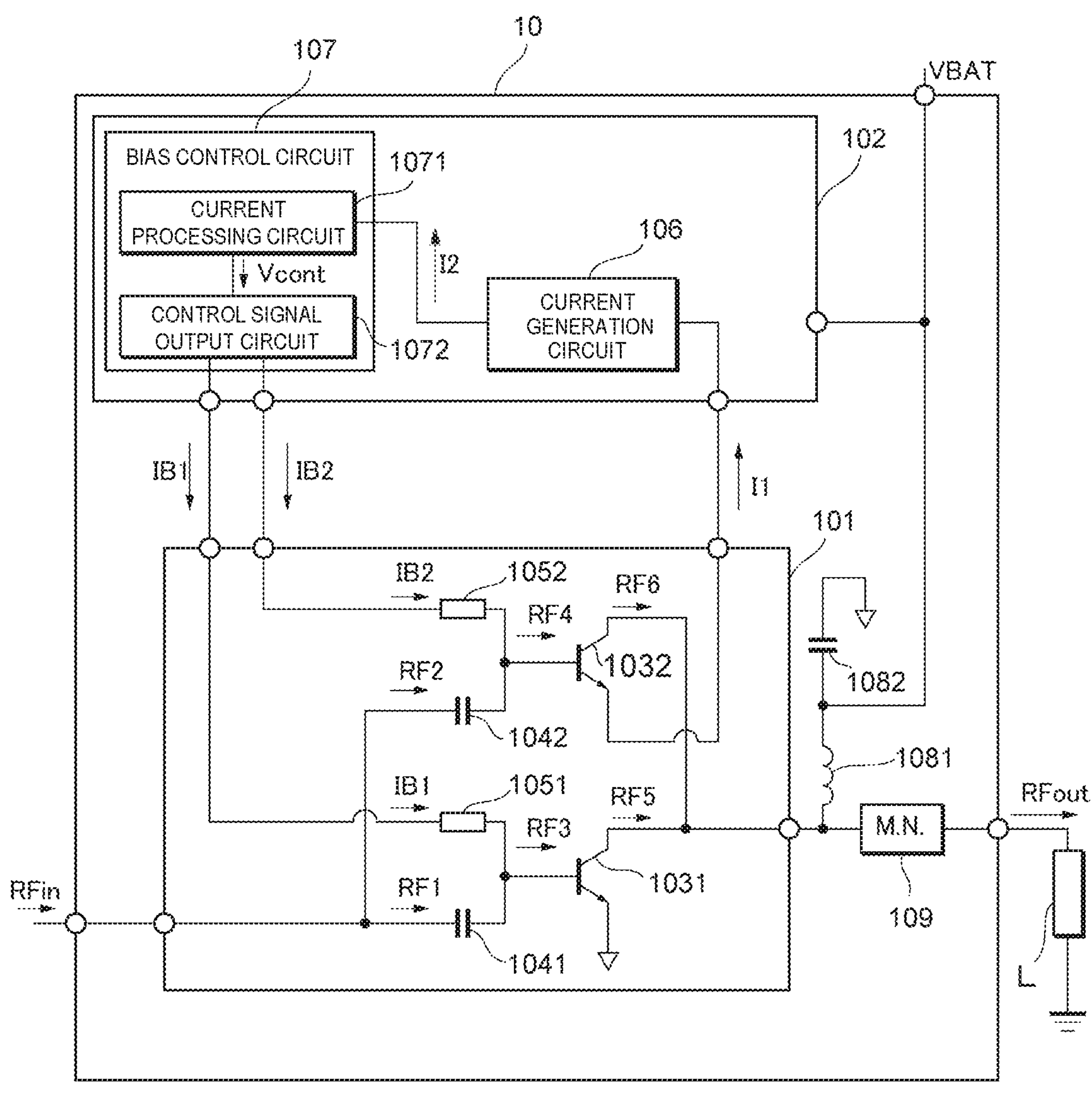
FIG. 1 is a circuit diagram of a transmission circuit according to a first embodiment.

A first embodiment will be described. FIG. 1 is a circuit diagram of a transmission circuit 10 according to the first embodiment. The transmission circuit 10 includes an amplifier circuit 101 and a control circuit 102. The amplifier circuit 101 amplifies an input signal RFin and outputs an output signal RFout to an external load L. The load L is, for example, an antenna that transmits an RF signal. Note that in FIG. 2 and the subsequent figures, the load L is omitted.

The amplifier circuit 101 outputs a current I1 (first current) based on the input signal RFin to the control circuit 102. The control circuit 102 outputs a first bias control signal and a second bias control signal on the basis of the current I1 in order to control the operation of the amplifier circuit 101. The first bias control signal can include a first bias current IB1 and the second bias control signal can include a second bias current IB2. In the drawings of this example, the first bias current IB1 and the second bias current IB2 are illustrated. Note that in each embodiment, a bias control signal can include a bias current itself and a signal for controlling the bias current.

In FIG. 1, the amplifier circuit 101 and the control circuit 102 are formed on or in different substrates. Note that the amplifier circuit 101 and the control circuit 102 may be formed on or in the same substrate.

The amplifier circuit 101 includes transistors 1031 and 1032, capacitors 1041 and 1042, and resistance elements 1051 and 1052.

The transistors 1031 and 1032 are, for example, bipolar transistors, such as heterojunction bipolar transistors (HBTs). Note that the transistors 1031 and 1032 may be field-effect transistors, such as MOSFETs (Metal-Oxide-Semiconductor Field-Effect Transistors), instead of HBTs.

In this case, a collector, a base, and an emitter described below need to be read as a drain, a gate, and a source, respectively.

The transistor 1031 (first amplifier transistor) has a base that is connected to the input of the amplifier circuit 101 with the capacitor 1041 interposed therebetween, an emitter that is connected to the ground, and a collector that is connected to the output of the amplifier circuit 101. The transistor 1031 amplifies a signal RF3 input to its base and outputs a signal RF5. The collector of the transistor 1031 is connected to the load L with a matching network 109 interposed therebetween. The matching network 109 adjusts the impedance between the amplifier circuit 101 and the outside of the transmission circuit 10.

The capacitor 1041 connects the base of the transistor 1031 and the input of the amplifier circuit 101. The capacitor 1041 supplies a signal obtained by removing the DC component of a signal RF1, which is a part of the input signal RFin, to the transistor 1031.

The resistance element 1051 connects the control circuit 102 described below and the base of the transistor 1031. The resistance element 1051 causes a voltage drop based on the bias current IB1 from the control circuit 102 to occur to suppress thermal runaway of the transistor 1031.

The signal RF3 that includes the RF signal having passed through the capacitor 1041 and the bias current IB1 (first bias current) having passed through the resistance element 1051 is input to the base of the transistor 1031.

The transistor 1032 (second amplifier transistor) has a base that is connected to the input of the amplifier circuit 101 with the capacitor 1042 interposed therebetween, an emitter that is connected to the control circuit 102 described below, and a collector that is connected to the collector of the transistor 1031. The collector of the transistor 1032 is connected to the load L with the matching network 109 interposed therebetween.

The transistor 1032 amplifies a signal RF4 input to its base and outputs a signal RF6.

The output signal RFout that includes the signal RF5 and the signal RF6 is supplied to the external load L through the matching network (MN) 109.

The capacitor 1042 connects the base of the transistor 1032 and the input of the amplifier circuit 101. The capacitor 1042 is connected in parallel with the capacitor 1041. The input signal RFin is supplied to the capacitor 1041 and to the capacitor 1042 as the signal RF1 and a signal RF2, respectively. The capacitor 1042 supplies a signal obtained by removing the DC component of the signal RF2, which is a part of the input signal RFin, to the transistor 1032.

The resistance element 1052 connects the control circuit 102 described below and the base of the transistor 1032. The resistance element 1052 causes a voltage drop based on the bias current IB2 from the control circuit 102 to occur to suppress thermal runaway of the transistor 1032.

The signal RF4 that includes the RF signal having passed through the capacitor 1042 and the bias current IB2 (second bias current) having passed through the resistance element 1052 is input to the base of the transistor 1032.

To the collectors of the transistors 1031 and 1032, a supply voltage VBAT for the transmission circuit 10 is supplied through an inductor 1081. The supply voltage VBAT is, for example, a voltage supplied from a battery. A capacitor 1082 connects the inductor 1081 and the ground.

The inductor 1081 is an element that prevents an alternating current signal from flowing toward the power supply. The capacitor 1082 is an element that reduces noise flowing into the transmission circuit 10.

The control circuit 102 includes a current generation circuit 106 and a bias control circuit 107. To the control circuit 102, the supply voltage VBAT is supplied. The control circuit 102 outputs the bias currents IB1 and IB2 on the basis of the current I1 from the amplifier circuit 101. Note that the control circuit 102 may output bias voltages instead of the bias currents.

The current generation circuit 106 is connected to the emitter of the transistor 1032. To the current generation circuit 106, the current I1, which is the emitter current of the transistor 1032, is input. The current generation circuit 106 generates a current I2 (second current) that flows in a direction in which a current is drawn from a current processing circuit 1071, on the basis of the current I1 (first current). The current I1 and the current I2 are in proportion to each other and, for example, the current I2 increases in response to an increase in the current I1 and the current I2 decreases in response to a decrease in the current I1.

The bias control circuit 107 includes the current processing circuit 1071 and a control signal output circuit 1072. The current processing circuit 1071 outputs a control voltage Vcont to the control signal output circuit 1072 on the basis of the current I2. In response to an increase in the current I2, the current processing circuit 1071 outputs the control voltage Vcont for decreasing the bias currents IB1 and IB2. In response to a decrease in the current I2, the current processing circuit 1071 outputs the control voltage Vcont for increasing the bias currents IB1 and IB2.

The control signal output circuit 1072 outputs the bias currents IB1 and IB2 on the basis of the control voltage Vcont. When the control signal output circuit 1072 outputs the bias currents IB1 and IB2, the bias currents for the transistors 1031 and 1032 can be controlled.

An operation of the transmission circuit 10 when the impedance of the load L fluctuates will be described. Here, an example case where a fluctuation occurs in which the impedance of the load L increases will be described.

In response to an increase in the impedance of the load L, the power of the output signal RFout decreases. The decrease in the power of the output signal RFout is caused by a decrease in the power of the signal RF5 and that of the signal RF6. The decrease in the power of the signal RF5 and that of the signal RF6 is caused by decreases in the collector currents of the transistors 1031 and 1032.

In response to the decrease in the collector current of the transistor 1032, the current I1, which is the emitter current of the transistor 1032, decreases. The decrease in the current I1 causes a decrease in the current I2 that is drawn by the current generation circuit 106 from the current processing circuit 1071.

In response to the decrease in the current I2, the current processing circuit 1071 supplies the control voltage Vcont for increasing the bias currents IB1 and IB2 to the control signal output circuit 1072. The control signal output circuit 1072 outputs the bias currents IB1 and IB2 that have been increased on the basis of the control voltage Vcont.

The increases in the bias currents IB1 and IB2 cause an increase in the collector current of the transistor 1031 and in the collector current of the transistor 1032. Therefore, the power of the signal RF5 and that of the signal RF6 increase. Accordingly, the power of the output signal RFout increases.

When the impedance of the load L increases, the transmission circuit 10 compensates for the decrease in the power of the output signal RFout by feedback control for increasing the bias currents IB1 and IB2. Accordingly, the transmission circuit 10 can appropriately control the power of the output signal RFout when a fluctuation in the impedance of the load L occurs.

Although a description of a case where the impedance of the load L increases has been given above, the transmission circuit 10 can appropriately control the power of the output signal RFout even when the impedance of the load L decreases. In this case, the decrease in the impedance causes an increase in the power of the output signal RFout. The transmission circuit 10 suppresses the increase in the power of the output signal RFout by feedback control for decreasing the bias currents IB1 and IB2.

Figure 2:
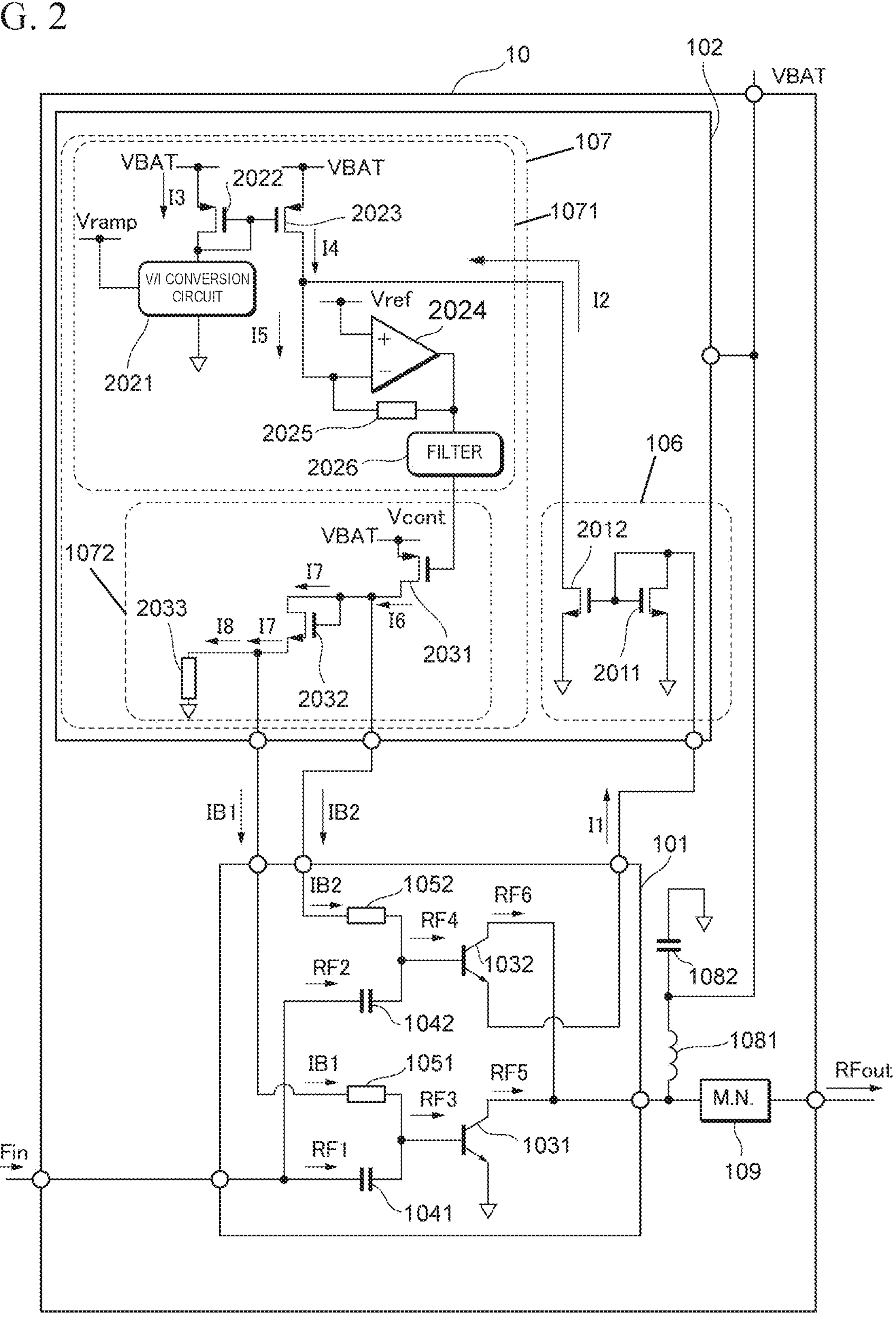
FIG. 2 is a detailed circuit diagram of the transmission circuit according to the first embodiment.

The details of the control circuit 102 will be described with reference to FIG. 2. FIG. 2 is a circuit diagram illustrating the current generation circuit 106 and the bias control circuit 107.

The current generation circuit 106 includes a transistor 2011 and a transistor 2012. The transistors 2011 and 2012 are, for example, N-channel MOSFETs.

The transistor 2011 (first control transistor) has a gate and a drain that are diode-connected. The drain of the transistor 2011 is connected to the emitter of the transistor 1032 and the source thereof is connected to the ground.

The transistor 2012 (second control transistor) is current-mirror-connected with the transistor 2011. The transistor 2012 has a drain that is connected to the inverting input terminal of a transimpedance amplifier 2024 described below and a source that is connected to the ground.

The current generation circuit 106 draws a current from the current processing circuit 1071 by making the current I2 having a predetermined current value ratio to the current I1 flow from the drain to the source of the transistor 2012.

When the current generation circuit 106 detects the emitter current of the transistor 1032, the effect of noise can be reduced even when the emitter voltage of the transistor 1032 has a very small value close to the ground voltage.

The current processing circuit 1071 includes a V/I conversion circuit 2021, transistors 2022 and 2023, the transimpedance amplifier 2024, a resistance element 2025, and a filter 2026.

To the V/I conversion circuit 2021, a voltage Vramp generated on the basis of the supply voltage VBAT is supplied. The V/I conversion circuit 2021 is a voltage-current conversion circuit that produces a predetermined current on the basis of the voltage Vramp.

The transistors 2022 and 2023 are, for example, P-channel MOSFETs. The transistor 2022 has a gate and a drain that are diode-connected. The drain of the transistor 2022 is connected to the V/I conversion circuit 2021 and the source thereof is connected to the power supply that supplies the supply voltage VBAT.

The transistor 2023 is current-mirror-connected with the transistor 2022. The transistor 2023 has a source that is connected to the power supply that supplies the supply voltage VBAT and a drain that is connected to the drain of the transistor 2012 and to the inverting input terminal of the transimpedance amplifier 2024.

When the V/I conversion circuit 2021 performs voltage-current conversion based on the voltage Vramp, a current I3 flows from the source to the drain of the transistor 2022. Based on the current I3, a current I4 flows from the source to the drain of the transistor 2023.

The transimpedance amplifier 2024 is an operational amplifier, has a non-inverting input terminal to which a voltage Vref based on the supply voltage VBAT is supplied, and has the inverting input terminal to which a current is supplied.

The resistance element 2025 connects the inverting input terminal and the output terminal of the transimpedance amplifier 2024. The resistance element 2025 is a feedback resistor. The transimpedance amplifier 2024 and the resistance element 2025 function as a transimpedance circuit. The transimpedance amplifier 2024 outputs from its output terminal, a voltage signal based on a current I5. The voltage value of the voltage signal from the transimpedance amplifier 2024 increases in response to an increase in the amount of the current I5. The voltage signal from the transimpedance amplifier 2024 is supplied to the control signal output circuit 1072 through the filter 2026 as the control voltage Vcont.

In the circuit described above, the current value of the current I4 from the drain of the transistor 2023 is a predetermined value. The current I5 is a current obtained by removing the current I2 from the current I4. In response to an increase in the current value of the current I1, the current value of the current I2 also increases. Therefore, in response to the increase in the current I1, the current I5 decreases. Furthermore, in response to a decrease in the current I1, the current I5 increases.

In response to the decrease in the current I5, the voltage value of the control voltage Vcont decreases. Therefore, in response to the increase in the current I1, the control voltage Vcont decreases. In response to the decrease in the current I1, the control voltage Vcont increases.

The control signal output circuit 1072 includes transistors 2031 and 2032 and a resistance element 2033. The transistors 2031 is, for example, a P-channel MOSFET. The transistors 2032 is, for example, an N-channel MOSFET.

The transistor 2031 has a gate that is connected to the filter 2026, a source that is connected to the power supply that supplies the supply voltage VBAT, and a drain that is connected to the transistor 1032 with the resistance element 1052 interposed therebetween.

The transistor 2031 (third control transistor) outputs from its drain, a current I6 corresponding to the control voltage Vcont. A part of the current I6 output from the drain of the transistor 2031 is supplied to the transistor 1032 as the bias current IB2.

The transistor 2032 has a gate and a drain that are diode-connected. The drain of the transistor 2032 is connected to the drain of the transistor 2031 and the source thereof is connected to the transistor 1031 with the resistance element 1051 interposed therebetween.

The transistor 2032 operates when a current I7, which is a part of the current I6, is supplied from the transistor 2031. The current I7 is output from the source of the transistor 2032. A signal based on the current I7 causes a predetermined voltage drop to occur by the transistor 2032. A part of the current I7 is supplied to the transistor 1031 as the bias current IB1.

The resistance element 2033 connects the source of the transistor 2032 and the ground. The resistance element 2033 is provided in order to keep the source of the transistor 2032 at a voltage higher than the ground voltage.

In response to an increase in the control voltage Vcont, the current I6 increases, and the bias current IB2 consequently increases. Furthermore, in response to the increase in the current I6, the current I7 also increases. In response to the increase in the current I7, the bias current IB1 increases. Therefore, the increase in the control voltage Vcont brings the increases in the bias currents IB1 and IB2. Similarly, a decrease in the control voltage Vcont brings decreases in the bias currents IB1 and IB2. Accordingly, the bias control circuit 107 can output the bias currents IB1 and IB2 so as to appropriately control the power of the output signal RFout.

Note that the transistors 2011 and the transistor 2032 can be formed as transistors having similar characteristics. In the transmission circuit 10, the emitter of the transistor 1031 is connected to the ground, and the emitter of the transistor 1032 is connected to the drain of the transistor 2011. Therefore, the emitter voltage of the transistor 1032 is higher than the ground voltage by a voltage drop at the transistor 2011.

Accordingly, the amplification operation by the transistor 1031 is performed at a base-emitter voltage not similar to a base-emitter voltage at which the amplification operation by the transistor 1032 is performed, and the transistor 1032 might not be able to appropriately replicate the operation of the transistor 1031.

When the transistor 2011 and the transistor 2032 are formed as transistors having similar characteristics, a voltage drop caused by the transistor 2032 can be a drop similar to the voltage drop caused by the transistor 2011. Accordingly, the transistor 2032 can cause a voltage drop in the base voltage of the transistor 1032 corresponding to the increase in the emitter voltage of the transistor 1032 to occur.

When the voltage drop is caused to occur, the base voltage of the transistor 1032 can be made higher than the base voltage of the transistor 1031 by the increase in the emitter voltage of the transistor 1032. Therefore, the base-emitter voltage at the transistor 1031 and the base-emitter voltage at the transistor 1032 can be made equal to each other. Accordingly, the transistor 1032 can appropriately replicate the operation of the transistor 1031.

Furthermore, forming the transistor 2011 and the transistor 2032 as transistors having similar characteristics reduces variations in the characteristics of the transistors upon manufacturing and stabilizes an operation against fluctuations in the external environment.

Figure 3:
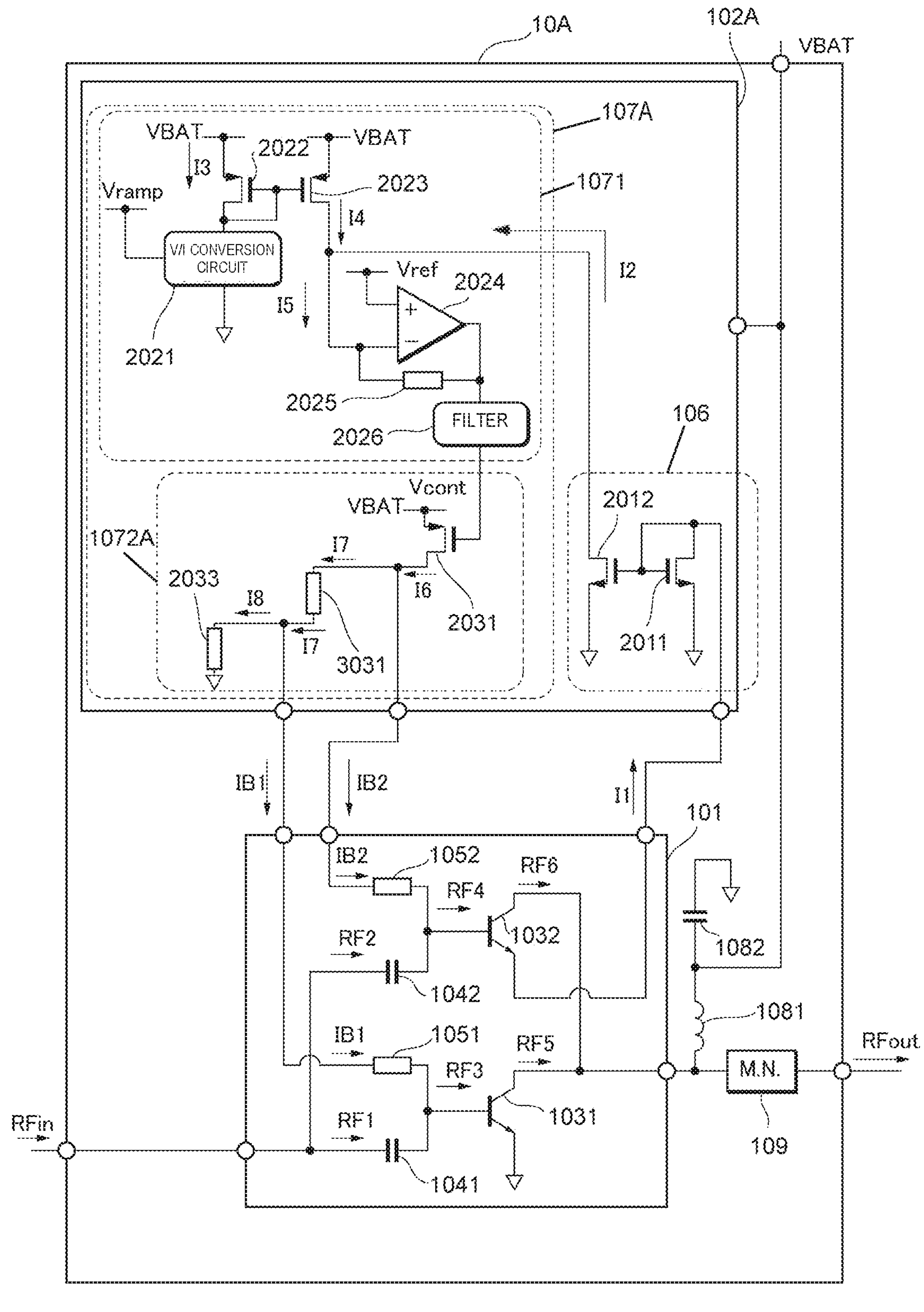
FIG. 3 is a detailed circuit diagram of another transmission circuit according to the first embodiment.

FIG. 3 is a circuit diagram of another transmission circuit 10A according to the first embodiment. The transmission circuit 10A is a circuit obtained by replacing the transistor 2032 of the control circuit 102 with a resistance element 3031. When the resistance element 3031 is used to cause the voltage drop that cancels out the increase in the emitter voltage of the transistor 1032 caused by the transistor 2011 to occur, the transistor 1032 can appropriately replicate the operation of the transistor 1031. Providing a voltage drop element exemplified by the transistor 2032 or the resistance element 3031 allows the operation to be replicated appropriately.

A second embodiment will be described. In the second and subsequent embodiments, a description of a matter common to the first embodiment will be omitted and only differences will be described. Specifically, similar effects attained by similar configurations will not be mentioned one by one in each embodiment.

Figure 4:
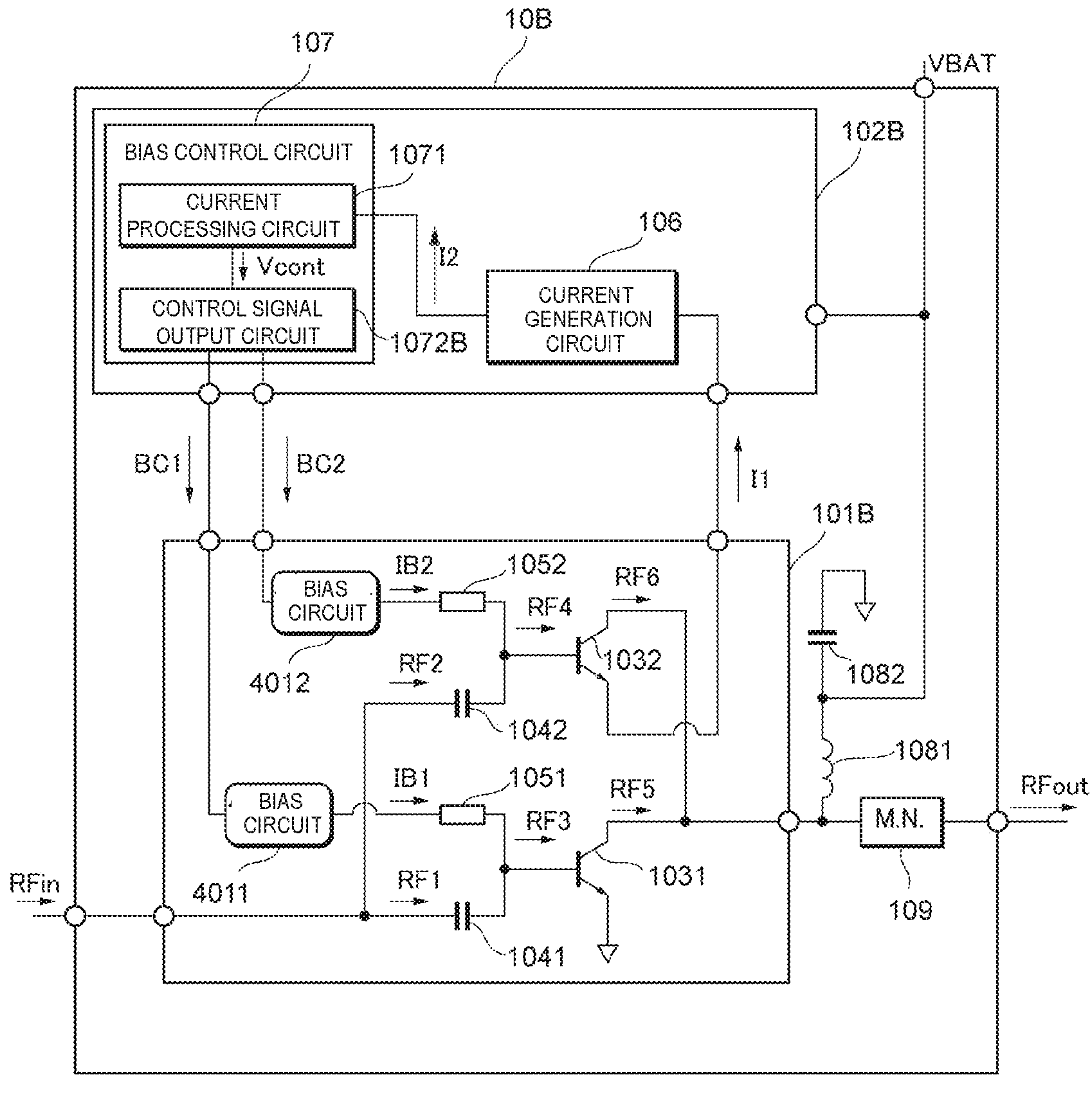
FIG. 4 is a circuit diagram of a transmission circuit according to a second embodiment.

FIG. 4 is a circuit diagram of a transmission circuit 10B according to the second embodiment. The transmission circuit 10B is different from the transmission circuit 10 in that an amplifier circuit 101B includes a bias circuit 4011 and a bias circuit 4012 and a control circuit 102B includes a control signal output circuit 1072B.

The bias circuit 4011 (first bias circuit) is provided between the control circuit 102B and the resistance element 1051. The bias circuit 4011 supplies the bias current IB1 to the transistor 1031 on the basis of a bias control signal BC1 (first bias control signal) from the control circuit 102B.

The bias circuit 4012 (second bias circuit) is provided between the control circuit 102B and the resistance element 1052. The bias circuit 4012 supplies the bias current IB2 to the transistor 1032 on the basis of a bias control signal BC2 (second bias control signal) from the control circuit 102B.

The control signal output circuit 1072B outputs the bias control signal BC1 and the bias control signal BC2 to the amplifier circuit 101B on the basis of the control voltage Vcont. The control signal output circuit 1072B has a circuit configuration similar to that of the control signal output circuit 1072.

A difference between the transmission circuit 10 according to the first embodiment and the transmission circuit 10B is the types of signals supplied to the amplifier circuits 101 and 101B by the control circuits 102 and 102B. In the transmission circuit 10, the control signal output circuit 1072 supplies the bias currents IB1 and IB2 directly to the amplifier circuit 101 to thereby control the bias currents supplied to the transistors 1031 and 1032.

In the transmission circuit 10B, the control signal output circuit 1072B outputs the bias control signals BC1 and BC2 to the bias circuits 4011 and 4012 of the amplifier circuit 101B. In the transmission circuit 10B, the bias circuits 4011 and 4012 are used to control the bias currents supplied to the transistors 1031 and 1032.

In the transmission circuit 10B, the power of the output signal RFout can also be appropriately controlled in response to fluctuations in the impedance of the load as in the transmission circuit 10. Furthermore, in the transmission circuit 10B, the bias circuits 4011 and 4012 are provided to ensure isolation between the control circuit 102B and the transistors 1031 and 1032. Accordingly, an RF signal can be prevented from flowing from the transistors 1031 and 1032 toward the control circuit 102B.

Figure 5:
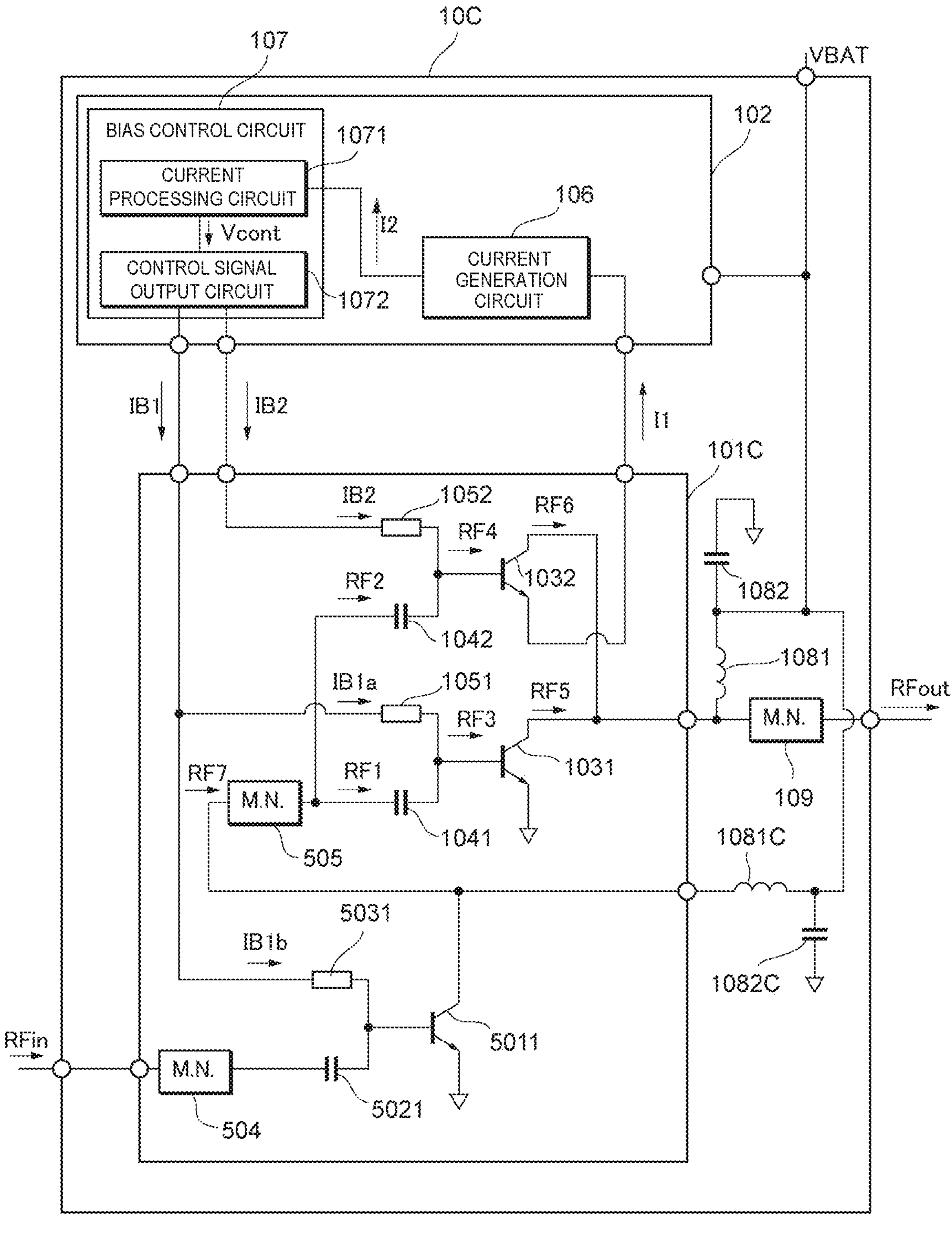
FIG. 5 is a circuit diagram of a transmission circuit according to a third embodiment.

A third embodiment will be described. FIG. 5 is a circuit diagram of a transmission circuit 10C according to the third embodiment. The transmission circuit 10C is different from the transmission circuit 10 in that the transmission circuit 10C includes an amplifier circuit 101C.

The amplifier circuit 101C includes a transistor 5011, a capacitor 5021, a resistance element 5031, and matching networks 504 and 505 in addition to the elements of the amplifier circuit 101.

The transistor 5011 (third amplifier transistor) has a base that is connected to the input of the transmission circuit 10C with the capacitor 5021 and the matching network 504 interposed therebetween, an emitter that is connected to the ground, and a collector that is connected to the capacitors 1041 and 1042 with the matching network 505 interposed therebetween.

To the collector of the transistor 5011, the supply voltage VBAT is supplied through an inductor 1081C. Between the inductor 1081C and the ground, a capacitor 1082C is provided.

In the amplifier circuit 101C, a bias current IB1*b* (third bias current), which is a part of the bias current IB1 from the control circuit 102, is supplied to the base of the transistor 5011 through the resistance element 5031. To the base of the transistor 1031, a bias current IB1*a* (first bias current), which is a part of the bias current IB1, is supplied.

The transistor 5011 amplifies the input signal RFin input to the amplifier circuit 101C and outputs a signal RF7 to the transistors 1031 and 1032. The signal RF7 is amplified by the transistors 1031 and 1032 as in the transmission circuit 10. Note that the transistor 5011 may be a MOSFET similarly to the transistors 1031 and 1032.

In the transmission circuit 10C, as in the transmission circuit 10, a decrease in the power of the output signal RFout causes a decrease in the current I1, which results in increases in the bias currents IB1 and IB2 from the control signal output circuit 1072. The increase in the bias current IB1 causes increases in the bias currents IB1*a* and IB1*b*. Therefore, as in the transmission circuit 10, the collector currents of the transistors 1031 and 1032 increase, and accordingly, the power of the output signal RFout can be appropriately controlled in response to fluctuations in the impedance of the load.

Furthermore, in the transmission circuit 10B, the increase in the bias current IB1*b* also causes an increase in the collector current of the transistor 5011, and accordingly, the power of the output signal RFout can be controlled across a wider range.

Note that the transistor 1032 may be configured such that the transistor 1032 is in parallel with the transistor 5011 and its collector is connected to the collector of the transistor 5011. Furthermore, a transistor may be provided in parallel with the transistor 5011 so as to correspond to the set of the transistor 1031 and the transistor 1032.

Figure 6:
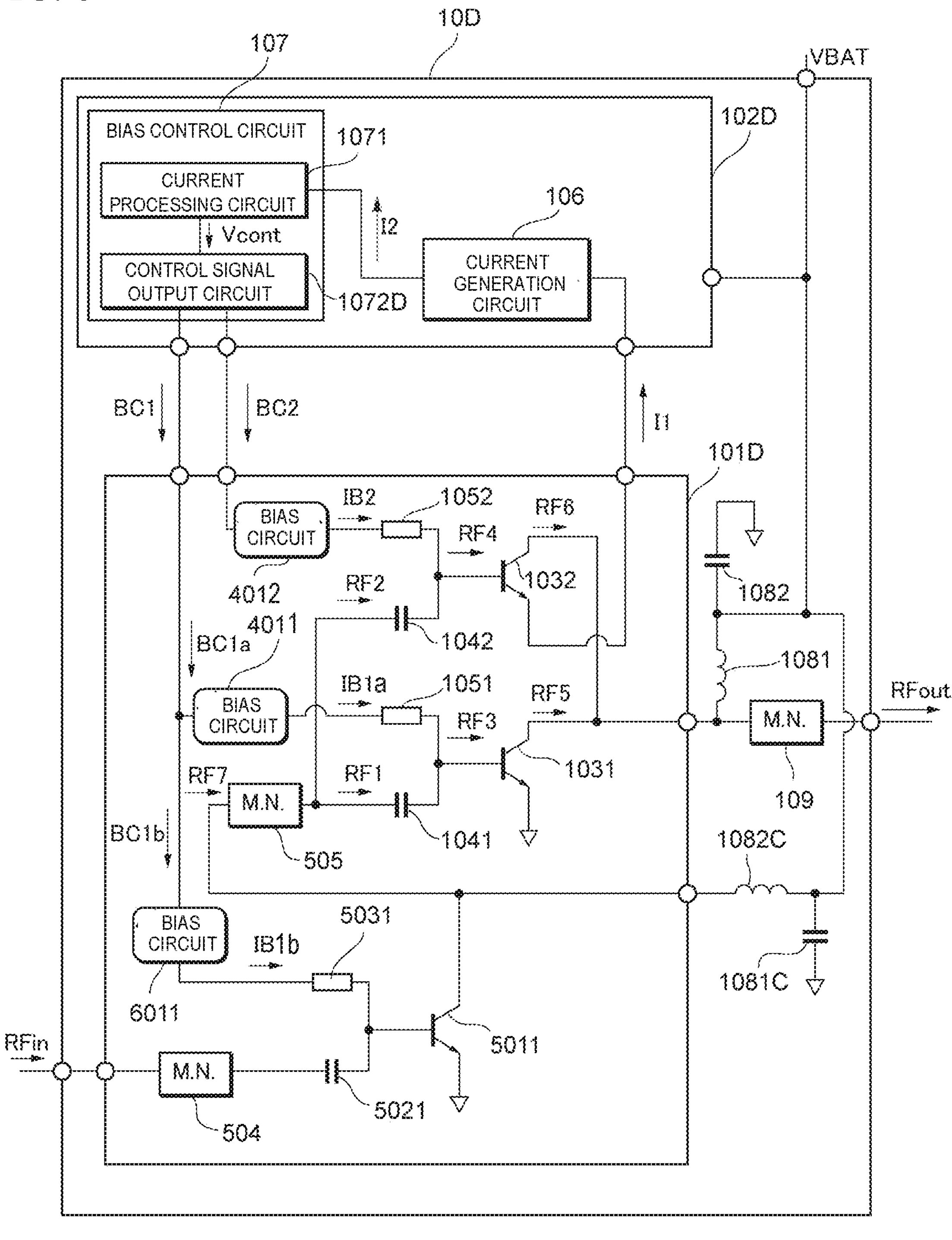
FIG. 6 is a circuit diagram of a transmission circuit according to a fourth embodiment.

A fourth embodiment will be described. FIG. 6 is a circuit diagram of a transmission circuit 10D according to the fourth embodiment. The transmission circuit 10D is a circuit obtained by providing in the transmission circuit 10C, bias circuits as in the transmission circuit 10B. Specifically, in the transmission circuit 10D, a bias circuit 6011 (third bias circuit) is provided between a control signal output circuit 1072D and the resistance element 5031.

In the transmission circuit 10D, the control signal output circuit 1072D outputs the bias control signals BC1 and BC2 as in the control signal output circuit 1072B. A bias control signal BC1*a*, which is a part of the bias control signal BC1 from a control circuit 102D, is supplied to the bias circuit 4011. The bias circuit 4011 supplies the bias current IB1*a* to the transistor 1031 on the basis of the bias control signal BC1*a*.

A bias control signal BC1*b*, which is another part of the bias control signal BC1, is supplied to the bias circuit 6011. The bias circuit 6011 supplies the bias current IB1*b* to the transistor 5011 on the basis of the bias control signal BC1*b*.

In the transmission circuit 10D, the power of the output signal RFout can also be appropriately controlled in response to fluctuations in the impedance of the load as in the transmission circuit 10. Furthermore, in the transmission circuit 10D, isolation between the control circuit 102D and the transistors 1031, 1032, and 5011 can be ensured as in the transmission circuit 10B. Accordingly, an RF signal can be prevented from flowing into the control circuit 102D.

Figure 7:
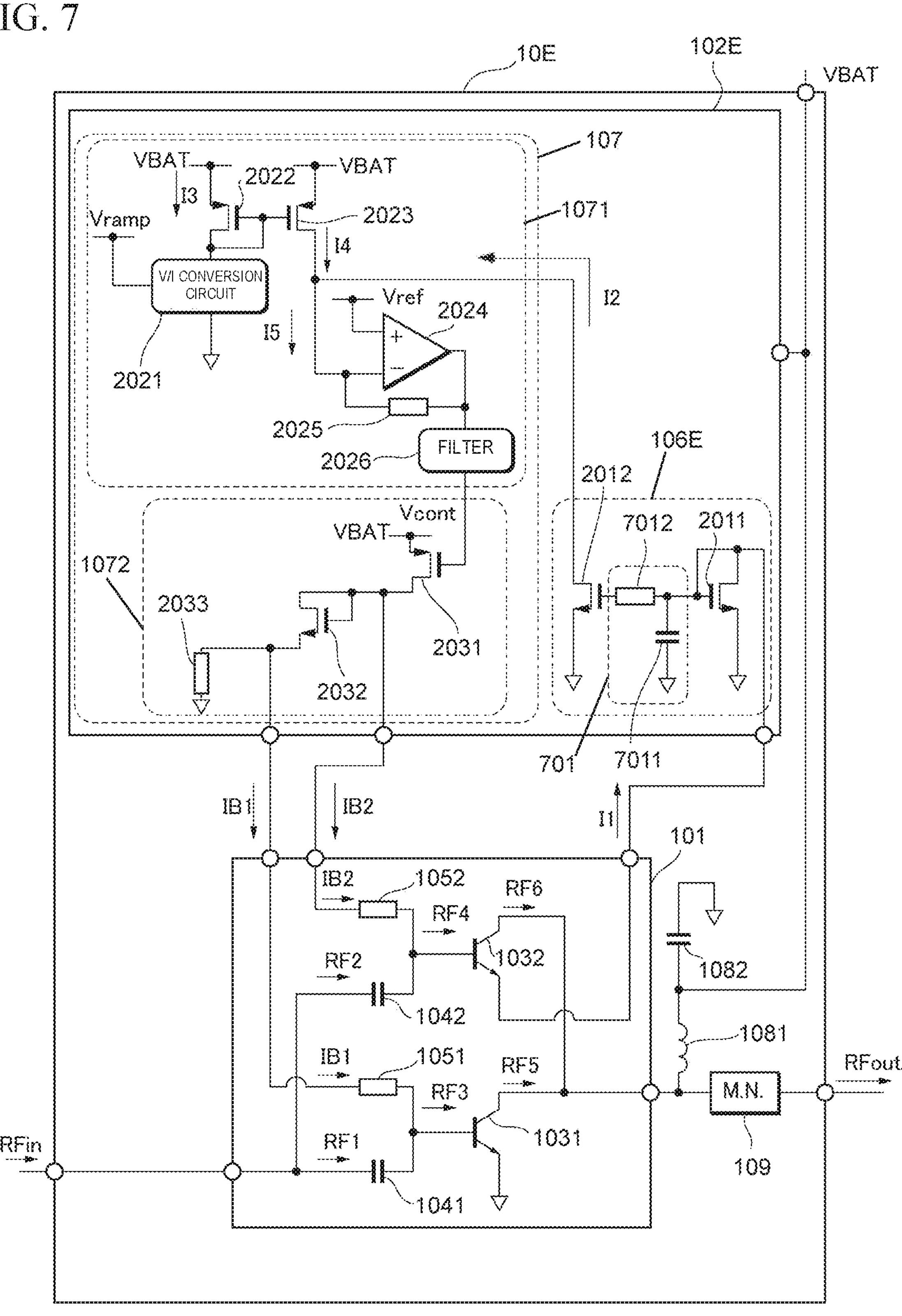
FIG. 7 is a detailed circuit diagram of a transmission circuit according to a fifth embodiment.

A fifth embodiment will be described. FIG. 7 is a circuit diagram of a transmission circuit 10E according to the fifth embodiment. The transmission circuit 10E is different from the transmission circuit 10 in that the transmission circuit 10E includes a current generation circuit 106E.

In the current generation circuit 106E, a filter circuit 701 is provided between the gates of the transistors 2011 and 2012. The filter circuit 701 includes a capacitor 7011 and a resistance element 7012.

The capacitor 7011 has one end that is connected to the gate of the transistor 2011 and the other end that is connected to the ground. The resistance element 7012 has one end that is connected to the capacitor 7011 and the gate of the transistor 2011 and the other end that is connected to the gate of the transistor 2012. The filter circuit 701 is an RC filter.

The current I1 includes both a DC component and an AC component. When the filter circuit 701 removes voltage fluctuations based on the AC component of the current I1, the current I2 can be a current based on only the DC component of the current I1. Accordingly, fluctuations in the current I2 can be appropriately suppressed, and the operation of a control circuit 102E can be made more stable.

Furthermore, in the transmission circuit 10E, the filter circuit 701 can be integrated and provided in the control circuit 102E. Accordingly, the filter circuit 701 can be provided in a substrate area smaller than in a case where, for example, a decoupling circuit that includes a resistance element, an inductor, and a capacitor is provided between the amplifier circuit 101 and the control circuit 102E. Note that the capacitor 7011 may be integrated into the substrate of the amplifier circuit 101. Furthermore, the capacitor 7011 may be provided on a substrate different from the substrates of the amplifier circuit 101 and the control circuit 102E as a surface mount device.

Figure 8:
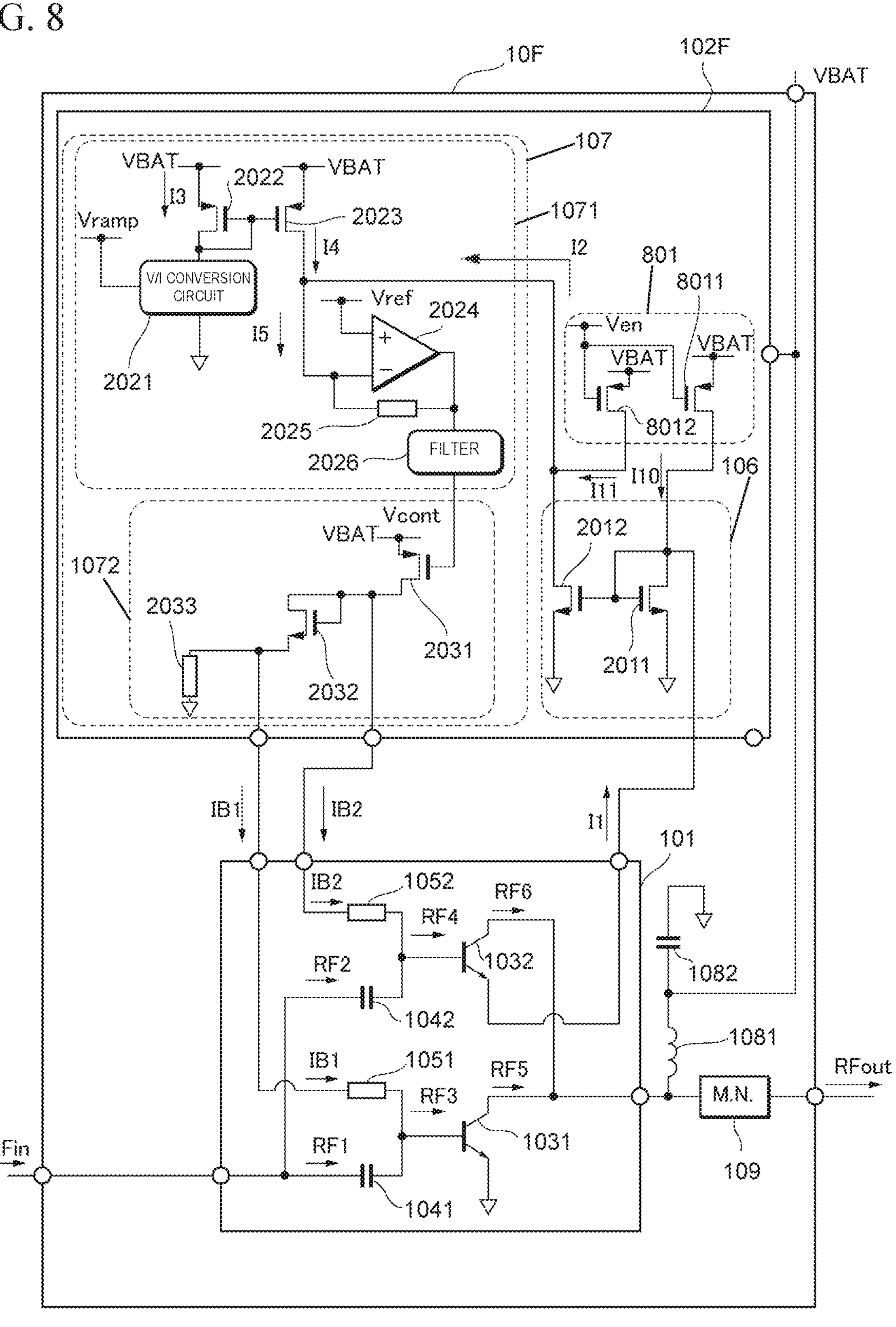
FIG. 8 is a detailed circuit diagram of a transmission circuit according to a sixth embodiment.

A sixth embodiment will be described. FIG. 8 is a circuit diagram of a transmission circuit 10F according to the sixth embodiment. The transmission circuit 10F is different from the transmission circuit 10 in that the transmission circuit 10F includes an offset current supply circuit 801.

The offset current supply circuit 801 includes transistors 8011 and 8012. The transistors 8011 and 8012 are, for example, P-channel MOSFETs.

The transistor 8011 has a gate to which a voltage Ven is supplied, a source that is connected to the power supply that supplies the supply voltage VBAT, and a drain that is connected to the drain of the transistor 2011. The voltage Ven is, for example, a voltage based on an enable signal in a control circuit 102F. The transistor 8011 outputs an offset current I10 (first offset current) to the transistor 2011 on the basis of the voltage Ven.

The transistor 8012 has a gate to which the voltage Ven is supplied, a source that is connected to the power supply that supplies the supply voltage VBAT, and a drain that is connected to the drain of the transistor 2012. The transistor 8012 outputs an offset current I11 (second offset current) to the transistor 2012 on the basis of the voltage Ven.

The transistors 8011 and 8012 have characteristics, that is, the ratio between the current values of the offset current I10 and the offset current I11 is similar to the ratio between the current values of the current I1 and the current I2 in the current generation circuit 106.

With the offset current supply circuit 801, a current that is a combination of the current I1 and the offset current I10 is input to the transistor 2011. Accordingly, the transistor 2011 operates in an operation region in which the IV characteristics of the transistor 2011 linearly change. Therefore, unstable changes in the current I2 caused by a nonlinear operation of the transistor 2011 can be avoided.

Furthermore, with the offset current supply circuit 801, a current equivalent to an increase in the current I2 caused by the offset current I10 is supplied as the offset current I11. Therefore, the increase in the current I2 caused by application of the offset current I10 to the transistor 2011 does not occur, and the current I2 becomes a current that reflects the current I1. Accordingly, in the transmission circuit 10F, the power of the output signal RFout can also be appropriately controlled in response to fluctuations in the impedance of the load.

Figure 9:
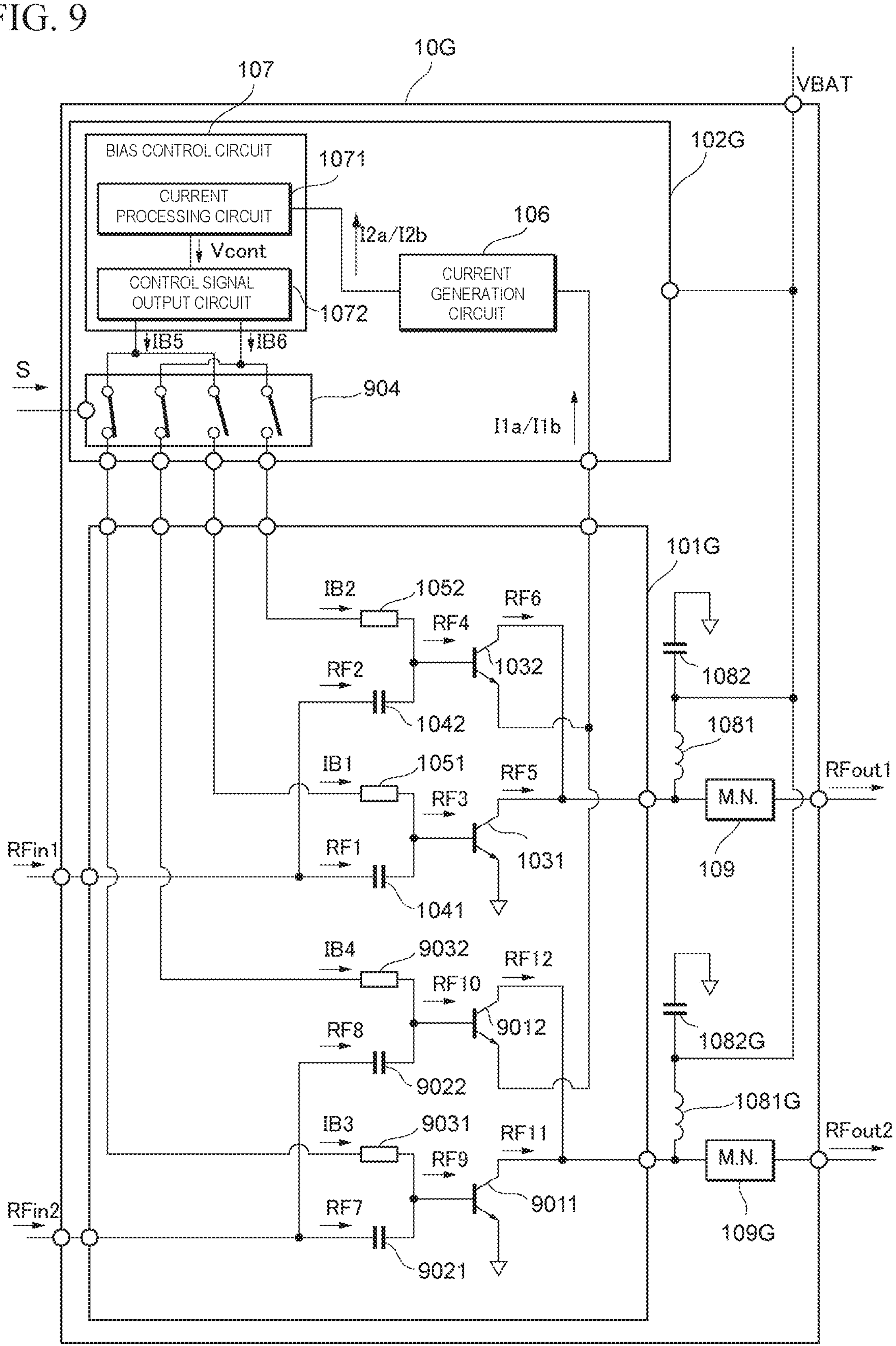
FIG. 9 is a circuit diagram of a transmission circuit according to a seventh embodiment.

A seventh embodiment will be described. FIG. 9 is a circuit diagram of a transmission circuit 10G according to the seventh embodiment. The transmission circuit 10G is different from the transmission circuit 10 in that the transmission circuit 10G includes an amplifier circuit 101G and a control circuit 102G. The transmission circuit 10G can output an output signal RFout1 obtained by amplifying an input signal RFin1 (first input signal) and an output signal RFout2 obtained by amplifying an input signal RFin2 (second input signal) having a frequency different from that of the input signal RFin1.

The amplifier circuit 101G includes transistor 9011 and 9012, capacitors 9021 and 9022, and resistance elements 9031 and 9032 in addition to the elements of the amplifier circuit 101.

The connections of the transistor 9011, the capacitor 9021, and the resistance element 9031 are similar to those of the transistor 1031, the capacitor 1041, and the resistance element 1051. The connections of the transistor 9012, the capacitor 9022, and the resistance element 9032 are similar to those of the transistor 1032, the capacitor 1042, and the resistance element 1052.

To the transistors 9011 (fourth amplifier transistor) and 9012 (fifth amplifier transistor), bias currents IB3 (fourth bias current) and IB4 (fifth bias current) are supplied, respectively. To the transistors 9011 and 9012, the supply voltage VBAT is supplied through an inductor 1081G. Between the inductor 1081G and the ground, a capacitor 1082G is provided.

The transistor 9011 amplifies a signal RF9 based on the signal RF7, which is a part of the input signal RFin2, and the bias current IB3 and outputs a signal RF11. The transistor 9012 amplifies a signal RF10 based on a signal RF8, which is another part of the input signal RFin2, and the bias current IB4 and outputs a signal RF12.

The output signal RFout2 that includes the signal RF11 and the signal RF12 is output to the outside of the transmission circuit 10G through a matching network 109G.

In the transmission circuit 10G, the transistor 1032 outputs a current I1*a* from its emitter to the control circuit 102G. The transistor 9012 outputs a current I1*b* (third current) from its emitter to the control circuit 102G. The current I1*a* is supplied to the control circuit 102G when the input signal RFin1 is amplified. The current I1B is supplied to the control circuit 102G when the input signal RFin2 is amplified. The current generation circuit 106 draws a current I2*a* based on the current I1*a* or a current I2*b* (fourth current) based on the current I1*b* from the current processing circuit 1071 in accordance with the currents from the amplifier circuit 101G.

The control circuit 102G includes a switch circuit 904. The switch circuit 904 switches the connections between the control signal output circuit 1072 and the transistors 1031, 1032, 9011, and 9012 on the basis of a control signal S that is externally input.

When the control signal S is a signal indicating that the input signal RFin1 is to be amplified, the switch circuit 904 connects the control signal output circuit 1072 with the transistors 1031 and 1032. At this time, the switch circuit 904 does not connect the control signal output circuit 1072 with the transistor 9011 or 9012.

When the input signal RFin2 is to be amplified, the switch circuit 904 connects the control signal output circuit 1072 with the transistors 9011 and 9012 and does not connect the control signal output circuit 1072 with the transistor 1031 or 1032.

To the control signal output circuit 1072, the control voltage Vcont based on the current I2*a* or the current I2*b* is supplied from the current processing circuit 1071. The control signal output circuit 1072 outputs a bias current IB5 and a bias current IB6 to the switch circuit 904 on the basis of the control voltage Vcont.

When the transmission circuit 10G amplifies the input signal RFin1, the bias current IB5 is supplied to the transistor 1031 as the bias current IB1. The bias current IB6 is supplied to the transistor 1032 as the bias current IB2.

When the transmission circuit 10G amplifies the input signal RFin2, the bias current IB5 is supplied to the transistor 9011 as the bias current IB3. The bias current IB6 is supplied to the transistor 9012 as the bias current IB4.

In the transmission circuit 10G, a plurality of input signals can be amplified and the power of the output signals can be controlled in response to fluctuations in the impedance of the load by using one control circuit 102G. Therefore, the transmission circuit 10G can be made smaller than a transmission circuit in which a control circuit is provided for each input signal.

Figure 10:
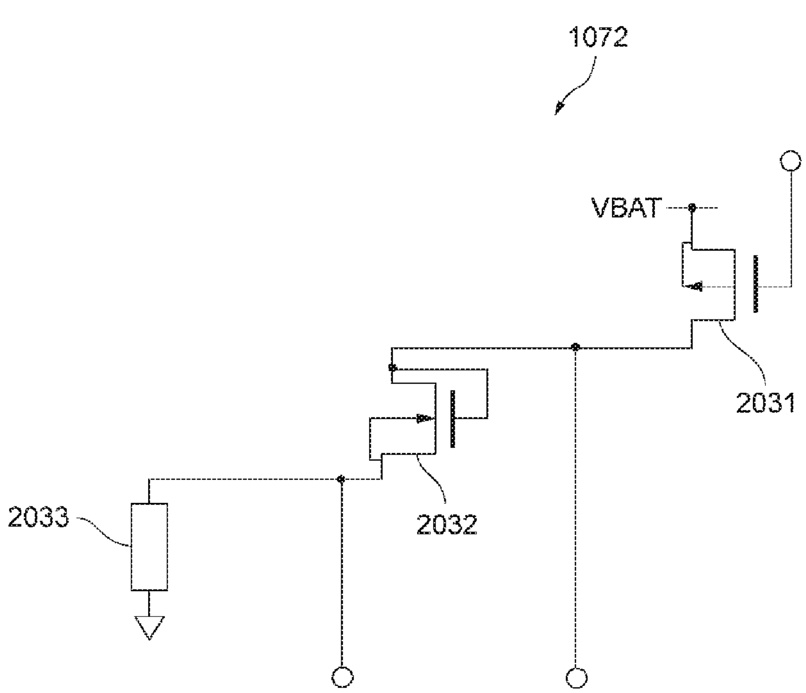
FIG. 10 is a circuit diagram for a detailed description of a control signal generation circuit.

In addition to the description of each embodiment, a more detailed description of the control signal output circuit 1072 will be given with reference to FIG. 10. FIG. 10 illustrates the transistor 2031 and the transistor 2032 in more detail. For the transistor 2032, a voltage different from the ground voltage needs to be applied to a terminal provided on or in a substrate on or in which the MOSFET is formed. This is implemented by, for example, an SOI CMOS process or a Triple Well Bulk CMOS process. Note that the Triple Well Bulk CMOS process is presented in, for example, Non Patent Document 1 in a description related to FIG. 11 of Non Patent Document 1.

The exemplary embodiments of the present disclosure have been described above. The transmission circuit 10 includes: the transistor 1031 to which the bias current IB1 is supplied and that amplifies and outputs the input signal RFin; the transistor 1032 to which the bias current IB2 is supplied, that has a collector connected to the collector of the transistor 1031, and that amplifies and outputs the input signal; the current generation circuit 106 that generates the current I2 on the basis of the current I1 from the emitter of the transistor 1032; and the bias control circuit 107 that outputs the first bias control signal for controlling the bias current IB1 and the second bias control signal for controlling the bias current IB2 on the basis of the current I2.

When the impedance of the load connected to the transmission circuit 10 fluctuates and increases, the current I1 decreases. The current I2 based on the current I1 is supplied to the bias control circuit 107. At this time, the bias control circuit 107 increases the bias currents IB1 and IB2 on the basis of the current I2. When the bias currents IB1 and IB2 increase, the output power from the transistor 1031 and the transistor 1032 increases, and the power of the output signal RFout increases. Therefore, in this case, the transmission circuit 10 performs feedback control for increasing the bias currents IB1 and IB2 to compensate for the decrease in the power of the output signal RFout. Accordingly, the transmission circuit 10 can appropriately control the power of the output signal RFout when a fluctuation in the impedance of the load L occurs.

The transmission circuit 10B further includes: the bias circuit 4011 that supplies the bias current IB1 to the transistor 1031 on the basis of the bias control signal BC1; and the bias circuit 4012 that supplies the bias current IB2 to the transistor 1032 on the basis of the bias control signal BC2. This can also appropriately control the power of the output signal RFout when a fluctuation in the impedance of the load L occurs. The bias control signals BC1 and BC2 can be currents having current values smaller than those of the bias currents IB1 and IB2, which can attain power saving and smaller wiring lines and circuit elements.

The transmission circuit 10C further includes: the transistor 5011 to which the bias current IB1*b* is supplied and that supplies the signal RF7 to the transistor 1031 and the transistor 1032, in which the bias control circuit 107 outputs the bias current IB1 for controlling the bias current IB1*a* and the bias current IB1*b*. This can increase a range across which the power of the output signal RFout can be controlled.

The transmission circuit 10D further includes: the bias circuit 6011 that supplies the bias current IB1*b* to the transistor 5011 on the basis of the bias control signal BC1*b*. This can attain power saving and smaller wiring lines and circuit elements as in the transmission circuit 10B.

In the transmission circuit 10, the current generation circuit 106 includes the transistor 2011 that has a drain connected to the emitter of the transistor 1032 and to which the current I1 is input and the transistor 2012 that is current-mirror-connected with the transistor 2011 and that outputs the current I2.

When the current generation circuit 106 is implemented as a current mirror circuit formed of the transistors 2011 and 2012 that are current-mirror-connected, the current I2 can be drawn from the bias control circuit 107 on the basis of the current I1. This allows the bias control circuit 107 to control the bias currents IB1 and IB2 in accordance with the amount of the current I2.

In the transmission circuit 10E, the current generation circuit 106 further includes the filter circuit 701 that is provided between the transistor 2011 and the transistor 2012. The filter circuit 701 can remove voltage fluctuations based on the AC component of the current I1. This can make the current I2 be a current based on only the DC component of the current I1. Therefore, fluctuations in the current I2 can be appropriately suppressed, and the operation of the control circuit 102E can be made more stable.

In the transmission circuit 10E, the filter circuit 701 includes the resistance element 7012 that has one end connected to the gate of the transistor 2011 and the other end connected to the gate of the transistor 2012 and the capacitor 7011 that is provided between the other end of the resistance element 7012 and the ground. The filter circuit 701 is integrated and provided in the control circuit 102E, which can reduce the area of the filter circuit 701 on the substrate. Therefore, the transmission circuit 10E becomes smaller than a transmission circuit in which elements are separately provided.

The transmission circuit 10F further includes: the offset current supply circuit 801 that supplies the offset current I10 to the transistor 2011 and that supplies the offset current I11 to the transistor 2012. With the offset current I10, the transistor 2011 operates in an operation region in which the IV characteristics of the transistor 2011 linearly change. Therefore, unstable changes in the current I2 caused by a nonlinear operation of the transistor 2011 can be avoided.

The transmission circuit 10G further includes: the transistor 9011 to which the bias current IB3 is supplied and that amplifies and outputs the input signal RFin2 having a frequency different from that of the input signal RFin1; the transistor 9012 to which the bias current IB4 is supplied, that has a collector connected to the collector of the transistor 9011, and that amplifies and outputs the input signal RFin2; and the switch circuit 904 to which a switch signal indicating which of the input signal RFin1 and the input signal RFin2 is to be amplified is input and that switches the connections between the bias control circuit 107 and the transistor 1031, the transistor 1032, the transistor 9011, and the transistor 9012 on the basis of the switch signal.

In the transmission circuit 10G, the current generation circuit 106 generates the current I2*b* on the basis of the current I1*b* from the emitter of the transistor 9012, the bias control circuit 107 outputs a third bias control signal for controlling the bias current IB3 and a fourth bias control signal for controlling the bias current IB4 on the basis of the current I2*b*, and the switch circuit 904 connects the transistor 1031 and the transistor 1032 with the bias control circuit 107 when the input signal RFin1 is to be amplified, and connects the transistor 9011 and the transistor 9012 with the bias control circuit 107 when the input signal RFin2 is to amplified.

Accordingly, even when a plurality of input signals are to be amplified, switching by the switch circuit 904 allows one control circuit 102G to control the power of the output signals in response to fluctuations in the impedance of the load.

In the transmission circuits 10 and 10A, the bias control circuits 107 and 107A include the transistor 2031 that outputs the bias current IB2 from its drain on the basis of the current I2, the transistor 2032 or the resistance element 3031 that outputs the bias current IB1 on the basis of the current I7, which is the output current of the transistor 2031, and the resistance element 2033 that is provided between the transistor 2032 or the resistance element 3031 and the ground.

The transistor 2032 or the resistance element 3031 can cause a voltage drop that cancels out an increase in the emitter voltage of the transistor 1032 caused by the transistor 2011 to occur. This allows the transistor 1032 to appropriately replicate the operation of the transistor 1031, and accordingly, when a fluctuation in the impedance of the load L occurs, the power of the output signal RFout can be more appropriately controlled.

The transistor 2032 is a transistor having a gate and a drain that are diode-connected and causing a voltage drop corresponding to the potential difference between the emitter of the transistor 1032 and the ground to occur. This can reduce variations in the characteristics of the transistor upon manufacturing and stabilize an operation against fluctuations in the external environment.

Note that each embodiment described above is intended to facilitate understanding of the present disclosure and is not intended to interpret the present disclosure in a limited manner. The present disclosure can be changed/improved without necessarily departing from the gist thereof, and the present disclosure includes its equivalents. That is, each embodiment to which a person skilled in the art makes design changes as appropriate is also included in the scope of the present disclosure as long as the embodiment has the characteristics of the present disclosure. For example, each element and its disposition, material, condition, shape, size, and so on in each embodiment are not limited to those illustrated and can be changed as appropriate. Furthermore, each embodiment is illustrative, configurations described in different embodiments can be partially replaced or combined as a matter of course, and these configurations can also be included in the scope of the present disclosure as long as the configurations have the characteristics of the present disclosure.

REFERENCE SIGNS LIST

10, 10A, 10B, 10C, 10D, 10E, 10F, 10G . . . transmission circuit, 101, 101B, 101C, 101G . . . amplifier circuit, 102, 102B, 102D, 102E, 102F, 102G . . . control circuit, 106, 106E . . . current generation circuit, 107, 107A . . . bias control circuit, 701 . . . filter circuit, 801 . . . offset current supply circuit, 904 . . . switch circuit

The invention claimed is:

1. A transmission circuit comprising:

a first amplifier transistor to which a first bias current or a first bias voltage is supplied, and that is configured to amplify a first input signal and to output a first amplified input signal;

a second amplifier transistor to which a second bias current or a second bias voltage is supplied, that has a collector or a drain connected to a collector or a drain of the first amplifier transistor, and that is configured to amplify the first input signal and to output a second amplified input signal;

a current generation circuit configured to generate a second current on the basis of a first current, the first current being from an emitter or a source of the second amplifier transistor; and a bias control circuit configured to output a first bias control signal that controls the first bias current or the first bias voltage, and a second bias control signal that controls the second bias current or the second bias voltage, on the basis of the second current.

2. The transmission circuit according to claim 1, further comprising:

a first bias circuit configured to supply the first bias current or the first bias voltage to the first amplifier transistor on the basis of the first bias control signal; and a second bias circuit configured to supply the second bias current or the second bias voltage to the second amplifier transistor on the basis of the second bias control signal.

3. The transmission circuit according to claim 1, further comprising:

a third amplifier transistor to which a third bias current or a third bias voltage is supplied, and that is configured to supply the first input signal to the first amplifier transistor and to the second amplifier transistor, wherein the bias control circuit is configured to output the first bias control signal, and the third bias current or the third bias voltage.

4. The transmission circuit according to claim 3, further comprising:

a third bias circuit configured to supply the third bias current or the third bias voltage to the third amplifier transistor on the basis of the first bias control signal.

5. The transmission circuit according to claim 1, wherein the current generation circuit comprises:

a first control transistor that has a drain connected to the emitter or the source of the second amplifier transistor and to which the first current is input; and a second control transistor that is current-mirror-connected with the first control transistor, and that is configured to output the second current.

6. The transmission circuit according to claim 5, wherein the current generation circuit further comprises a filter circuit that is between the first control transistor and the second control transistor.

7. The transmission circuit according to claim 6, wherein the filter circuit comprises:

a resistance circuit element that has a first end connected to a gate of the first control transistor and a second end connected to a gate of the second control transistor; and a capacitor that is between the second end of the resistance circuit element and ground.

8. The transmission circuit according to claim 5, further comprising:

an offset current supply circuit configured to supply a first offset current to the first control transistor, and to supply a second offset current to the second control transistor.

9. The transmission circuit according to claim 1, wherein the transmission circuit further comprises:

a fourth amplifier transistor to which a fourth bias current or a fourth voltage is supplied, and that is configured to amplify a second input signal and to output a third amplified input signal, the second input signal having a frequency different from a frequency of the first input signal;

a fifth amplifier transistor to which a fifth bias current or a fifth bias voltage is supplied, that has a collector connected to a collector of the fourth amplifier transistor, and that is configured to amplify the second input signal and to output a fourth input signal; and a switch circuit to which a switch signal is input, and that is configured to switch connection between the bias control circuit and the first amplifier transistor, the second amplifier transistor, the fourth amplifier transistor, and the fifth amplifier transistor on the basis of the switch signal, the switch signal indicating which of the first input signal and the second input signal is to be amplified, wherein the current generation circuit is configured to generate a fourth current on the basis of a third current, the third current being from an emitter or a source of the fifth amplifier transistor, wherein the bias control circuit is configured to output a third bias control signal that controls the fourth bias current or the fourth bias voltage, and a fourth bias control signal that controls the fifth bias current or the fifth bias voltage, on the basis of the fourth current, and wherein the switch circuit is configured to:

connect the first amplifier transistor and the second amplifier transistor to the bias control circuit when the switch signal indicates that the first input signal is to be amplified, and connect the fourth amplifier transistor and the fifth amplifier transistor to the bias control circuit when the switch signal indicates that the second input signal is to be amplified.

10. The transmission circuit according to claim 1, wherein the bias control circuit comprises:

a third control transistor configured to output the second bias control signal from a drain thereof on the basis of the second current, a voltage drop circuit element configured to output the first bias control signal on the basis of an output current of the third control transistor, and a resistance circuit element that is between the voltage drop circuit element and ground.

11. The transmission circuit according to claim 10, wherein the voltage drop circuit element is a transistor having a gate and a drain that are diode-connected, and that is configured to cause a voltage drop corresponding to a potential difference between the emitter or the source of the second amplifier transistor and ground.

* * * * *